US012636592B2

(12) United States Patent
Leoncini et al.

(10) Patent No.: US 12,636,592 B2
(45) Date of Patent: May 26, 2026

(54) SYSTEM TO COLLECT, RECOVER AND RECYCLE CHEMICAL EXHAUST FROM SEMICONDUCTOR PROCESSING CHAMBERS

(71) Applicant: Applied Materials, Inc., Santa Clara, CA (US)

(72) Inventors: Andrea Leoncini, Singapore (SG); Zhijie Chua, Singapore (SG)

(73) Assignee: Applied Materials, Inc., Santa Clara, CA (US)

(*) Notice: Subject to any disclaimer, the term of this patent is extended or adjusted under 35 U.S.C. 154(b) by 385 days.

(21) Appl. No.: 18/136,990

(22) Filed: Apr. 20, 2023

(65) Prior Publication Data
US 2024/0350962 A1 Oct. 24, 2024

(51) Int. Cl.
| | |
|---|---|
| *B01D 5/00* | (2006.01) |
| *B01D 8/00* | (2006.01) |
| *B01D 53/00* | (2006.01) |
| *B01D 53/75* | (2006.01) |
| *C23C 16/44* | (2006.01) |

(52) U.S. Cl.
CPC ............. *B01D 5/0036* (2013.01); *B01D 8/00* (2013.01); *B01D 53/002* (2013.01); *B01D 53/75* (2013.01); *B01D 2221/14* (2013.01); *B01D 2257/108* (2013.01); *B01D 2257/11* (2013.01); *B01D 2258/0216* (2013.01); *C23C 16/4412* (2013.01); *Y10S 55/15* (2013.01)

(58) Field of Classification Search
None
See application file for complete search history.

(56) References Cited

U.S. PATENT DOCUMENTS

| | | | | |
|---|---|---|---|---|
| 6,332,925 | B1* | 12/2001 | Noji | B01D 53/002 62/55.5 |
| 6,383,257 | B1* | 5/2002 | McDermott | B01D 53/229 62/655 |
| 2003/0141016 | A1* | 7/2003 | Okase | B08B 7/0035 118/715 |
| 2005/0081786 | A1 | 4/2005 | Kubista et al. | |

(Continued)

FOREIGN PATENT DOCUMENTS

| | | | | |
|---|---|---|---|---|
| CN | 112430805 | A | 3/2021 | |
| CN | 115282724 | A * | 11/2022 | B01D 8/00 |

(Continued)

OTHER PUBLICATIONS

CN115282724A_ENG (Espacenet machine translation of Huang) (Year: 2022).*

(Continued)

*Primary Examiner* — Gabriel E Gitman
(74) *Attorney, Agent, or Firm* — SERVILLA WHITNEY LLC

(57) ABSTRACT

Chemical precursor recovery systems and methods of recovering and reusing semiconductor manufacturing chemistry are disclosed. The recovery systems include a cold trap inlet line in fluid communication with a plurality of cold traps and a cold trap outlet line. The plurality of cold traps is configured to condense the chemical precursors and are arranged based on semiconductor manufacturing process conditions.

19 Claims, 3 Drawing Sheets

(56) References Cited

U.S. PATENT DOCUMENTS

| | | | | |
|---|---|---|---|---|
| 2013/0276702 A1* | 10/2013 | Carlson | C23C 16/4412 | |
| | | | 422/169 | |
| 2014/0109973 A1* | 4/2014 | Neumeister | C23C 16/4412 | |
| | | | 137/1 | |
| 2014/0196664 A1 | 7/2014 | Johnson et al. | | |
| 2019/0301011 A1* | 10/2019 | Bajaj | C23C 16/4405 | |
| 2022/0112598 A1* | 4/2022 | Iyer | C23C 16/4412 | |

FOREIGN PATENT DOCUMENTS

| | | | |
|---|---|---|---|
| EP | 1052466 A1 | 11/2000 | |
| KR | 20030052240 A * | 6/2003 | |
| KR | 20180002954 A | 1/2018 | |
| KR | 20200113100 A | 10/2020 | |
| WO | WO-2011117231 A1 * | 9/2011 | C01B 7/20 |

OTHER PUBLICATIONS

KR20030052240A_ENG (Espacenet machine translation of Saito) (Year: 2023).*

KR20030052240A_ENG (Espacenet machine translation of Saito) (Year: 2003).*

PCT International Search Report and Written Opinion in PCT/US2024/025405 dated Aug. 8, 2024, 9 pages.

"Gas Separation Membranes, Gas Separation Membrane with High Performance and Robustness Against Contaminants", Fujifilm, Gas Separation Membrane Equipment, [Retrieved from the Internet Mar. 7, 2023] <URL: https://www.fujifilm.com/us/en/business/industrial-materials/gas-separation-membranes/overview> , 7 pages.

"Gas Separation, Sepuran Noble—Membranes for Efficient Helium Recovery", Evonik Industries, [Retrieved from the internet Mar. 7, 2023] <URL: https://www.membrane-separation.com/en/helium-recovery-with-sepuran-noble>, 3 pages.

"Sepuran Noble—Membrane Technology for Efficient Helium Recovery", Evonik brochure, 8 pages.

"Sepuran Noble—Membrane Technology for Efficient Helium Recovery & Purification", Evonik Corporation, Oct. 2020, 2 pages.

Wijmans, J. G., et al., "Recovery of perfluoroethane from chemical vapor deposition operations in the semiconductor industry", Separation and Purification Technology, 35 (2004), pp. 203-213.

* cited by examiner

SYSTEM TO COLLECT, RECOVER AND RECYCLE CHEMICAL EXHAUST FROM SEMICONDUCTOR PROCESSING CHAMBERS

TECHNICAL FIELD

Embodiments of the disclosure generally relate to apparatus and methods for collecting, recovering and recycling chemical compounds from the exhaust stream of a semiconductor manufacturing processing chambers. In particular, embodiments of the disclosure relate to apparatus and methods for separating, condensing and reusing chemistry associated with deposition and etching processes in semiconductor manufacturing.

BACKGROUND

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The various semiconductor components (e.g., interconnects, vias, capacitors, transistors) require precise placement of high aspect ratio features. Reliable formation of these components is critical to further increases in device and density.

Additionally, the electronic device industry and the semiconductor industry continue to strive for larger production yields while increasing the uniformity of layers deposited on substrates having increasingly larger surface areas. These same factors in combination with new materials also provide higher integration of circuits per unit area on the substrate.

During semiconductor manufacturing, expensive and potentially hazardous precursors and reactants are used. For example, chemical vapor deposition (CVD) atomic layer deposition (ALD) and etch processes often employ expensive chemical precursors which are used in excess to ensure complete reactions. These excess reactants and exhaust gases are sent to a scrubber for abatement and disposal. As a consequence, expensive chemicals are lost and potential greenhouse gases are released into the atmosphere. Currently, there are no such chemical recovery systems in use in the semiconductor industry.

Accordingly, there is a need in the art for apparatus and methods to recover semiconductor manufacturing process gases and reduce the environmental impact of semiconductor manufacturing.

SUMMARY

One or more embodiments of the disclosure are directed to chemical precursor recovery systems comprising a cold trap inlet line, a plurality of cold traps and a cold trap outlet line. The plurality of cold traps are downstream of and in fluid communication with the inlet line. Each of the cold traps is configured to condense the chemical precursor. The cold trap outlet line is downstream of and in fluid communication with the plurality of cold traps.

Additional embodiments of the disclosure are directed chemical precursor recovery systems for an atomic layer deposition processing chamber. The chemical precursor recovery system comprises a cold trap inlet line, a cold trap outlet line and a plurality of cold traps. The cold trap inlet line is configured to be connected to an exhaust line of the atomic layer deposition processing chamber. The cold trap outlet line is downstream of the cold trap inlet line. The plurality of cold traps is downstream of and in fluid communication with the inlet line. Each of the cold traps is configured to condense the chemical precursor. The plurality of cold traps are arranged in parallel with an inlet junction connected to and in fluid communication with the cold trap inlet line and an outlet junction connected to and in fluid communication with the cold trap outlet line downstream of the plurality of cold traps. Each cold trap has one or more of an upstream pneumatic valve or upstream manual valve, and one or more of a downstream pneumatic valve or downstream manual valve, to isolate each cold trap separately from the plurality of cold traps. A bypass line is in fluid communication with the inlet line upstream of the inlet junction and in fluid communication with the outlet line downstream of the outlet junction. The bypass line comprises an upstream bypass valve and a downstream bypass valve to isolate the bypass line from the plurality of cold traps.

Further embodiments of the disclosure are directed to chemical precursor recovery systems for a chemical vapor deposition processing chamber. The chemical precursor recovery system comprises a cold trap inlet line, a plurality of cold traps and a cold trap outlet line. The plurality of cold traps are downstream of and in fluid communication with the inlet line. Each of the cold traps is configured to condense the chemical precursor. The plurality of cold traps are arranged in series with a decreasing temperature gradient with the lowest temperature cold trap last. The cold trap closest to the inlet line has one or more of an upstream manual valve or upstream pneumatic valve, and one or more of a downstream pneumatic valve or downstream manual valve to isolate the cold trap. A pneumatic valve is positioned between each of the cold traps. One or more of a pneumatic valve or manual valve is downstream of the last cold trap. The cold trap outlet line is downstream of and in fluid communication with the plurality of cold traps. Each cold trap is connected to a downstream collection system through a collection line with a valve. The collection system comprises one or more of a compressor or gas cylinder.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
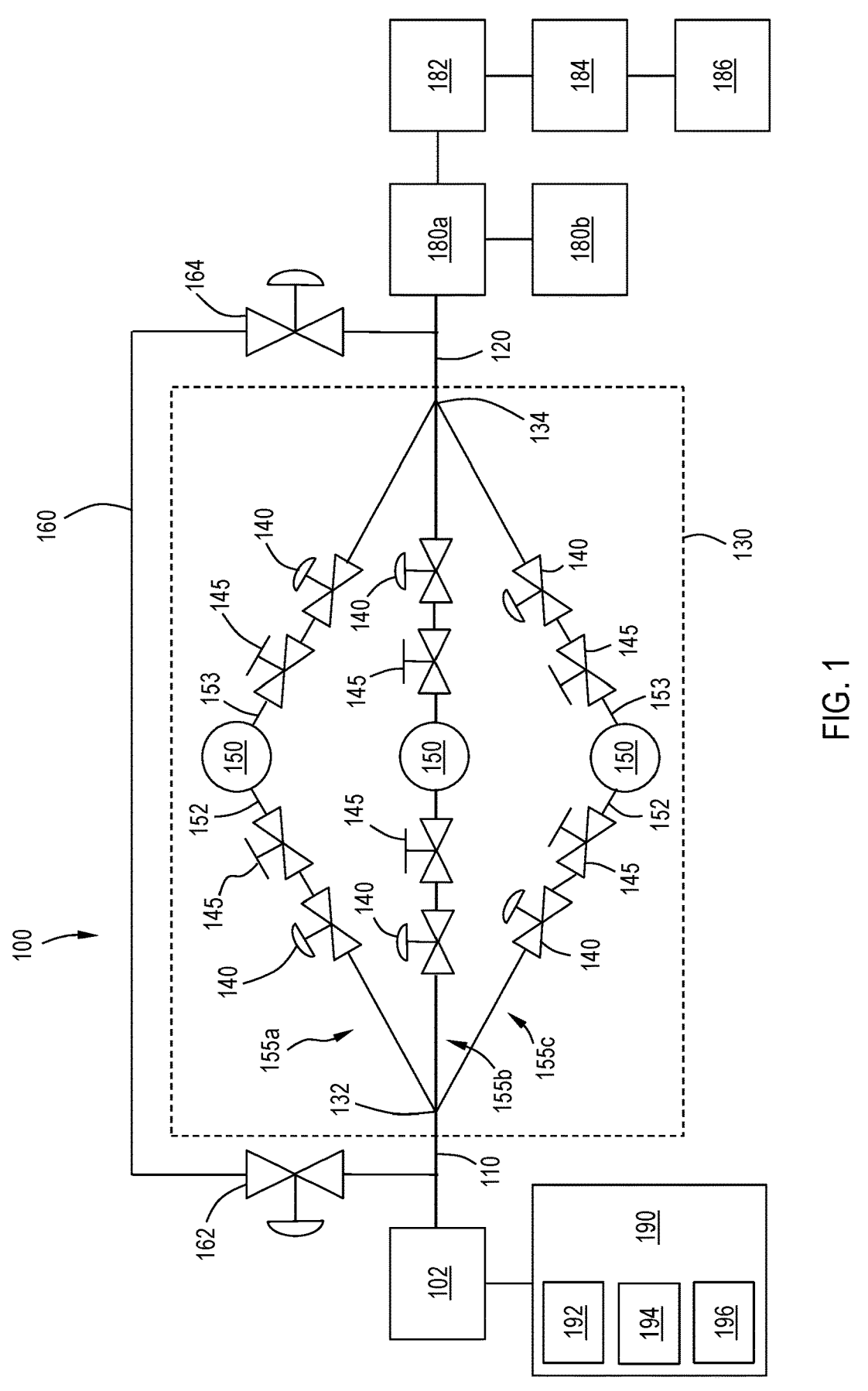
FIG. 1 illustrates a schematic representation of a chemical precursor recovery system with cold traps arranged in parallel according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and appended claims, "substrate support" and "substrate support pedestal" may be used interchangeably.

As used in this specification and appended claims, use of relative terms like "above" and "below" should not be taken as limiting the scope of the disclosure to a physical orientation in space. Accordingly, use of relative terms should not be limited to the direction specified by gravity.

One or more embodiments of the disclosure provide scrubber-less systems to collect, recover and/or recycle chemicals from the exhaust of a semiconductor manufacturing processing chamber. As used in this manner, the term "scrubber-less" means that a chemical scrubber is not needed for the collection and recycling of the reactive species. However, a scrubber-less system may include a scrubber as a precautionary measure to ensure that harmful chemicals are not released into the environment.

Some embodiments of the disclosure provide systems and methods to separate, collect and/or recover precursors and byproducts of deposition processes in ALD, CVD and etch chambers. Some embodiments employ a set of cold traps, pneumatic (manual or other types or) valves and gas separation membranes (GSM) to condense unreacted precursors, byproducts and other chemicals separately, instead of collective disposal through abatement systems. After the process, the collected chemicals can be isolated and, in some cases, reused.

In some embodiments, the semiconductor manufacturing processing chamber comprises one or more of a chemical vapor deposition (CVD) chamber, an atomic layer deposition (ALD) processing chamber, or an etch chamber. The exhaust from other processing chambers can also be routed through the recovery system and are within the scope of the disclosure. The primary difference between the ALD and CVD/etch chambers is the combination of exhaust components. An ALD chamber typically has a precursor and carrier gas components to the exhaust, while a CVD/etch chamber typically has a mixture of reactive species and carrier gases. In some embodiments, the recovery system separates the reactive species from the carrier gases. In some embodiments, the recovery system separates a mixture of reactive species into individual reactive species. In some embodiments, the recovery system separates carrier/diluent/inert gases from the reactive gases.

Some embodiments of the disclosure allow for the recovery of expensive precursors (e.g., noble metal precursors) and gases (e.g., helium, hydrogen), which can then be reused within the facility, or sent for purification. Some embodiments reduce the cost of operation of semiconductor manufacturing equipment by allowing reuse of expensive chemical precursors. Some embodiments allow for the recovery of greenhouse gases (e.g., methane, carbon dioxide, nitrous oxide), reducing the environmental impact of the semiconductor manufacturing facility.

Some embodiments provide systems that use cold traps (CTs) in series or parallel, and gas separation membranes. The systems can be arranged to receive the exhaust from a semiconductor manufacturing process chamber or tool.

In an ALD mode, as shown in FIG. 1 and discussed further below, cold traps are arranged in parallel with a bypass line. In some embodiments, each cold trap has manual valves followed by pneumatic valves. The bypass line has pneumatic valves. The pneumatic valves can be operated by chamber software to synchronize process steps with specific cold traps (or bypass line). The manual valves can be used for isolation of the cold traps from the system and subsequent recovery of the chemicals. While the term "pneumatic valve" is used herein, the skilled artisan will recognize that the disclosure is not limited to pneumatically-controlled valves. The term "pneumatic valve" is used herein to describe any valve that can be controlled by an automated system, as opposed to a manual valve which can only be controlled by manual operation.

Figure 3:
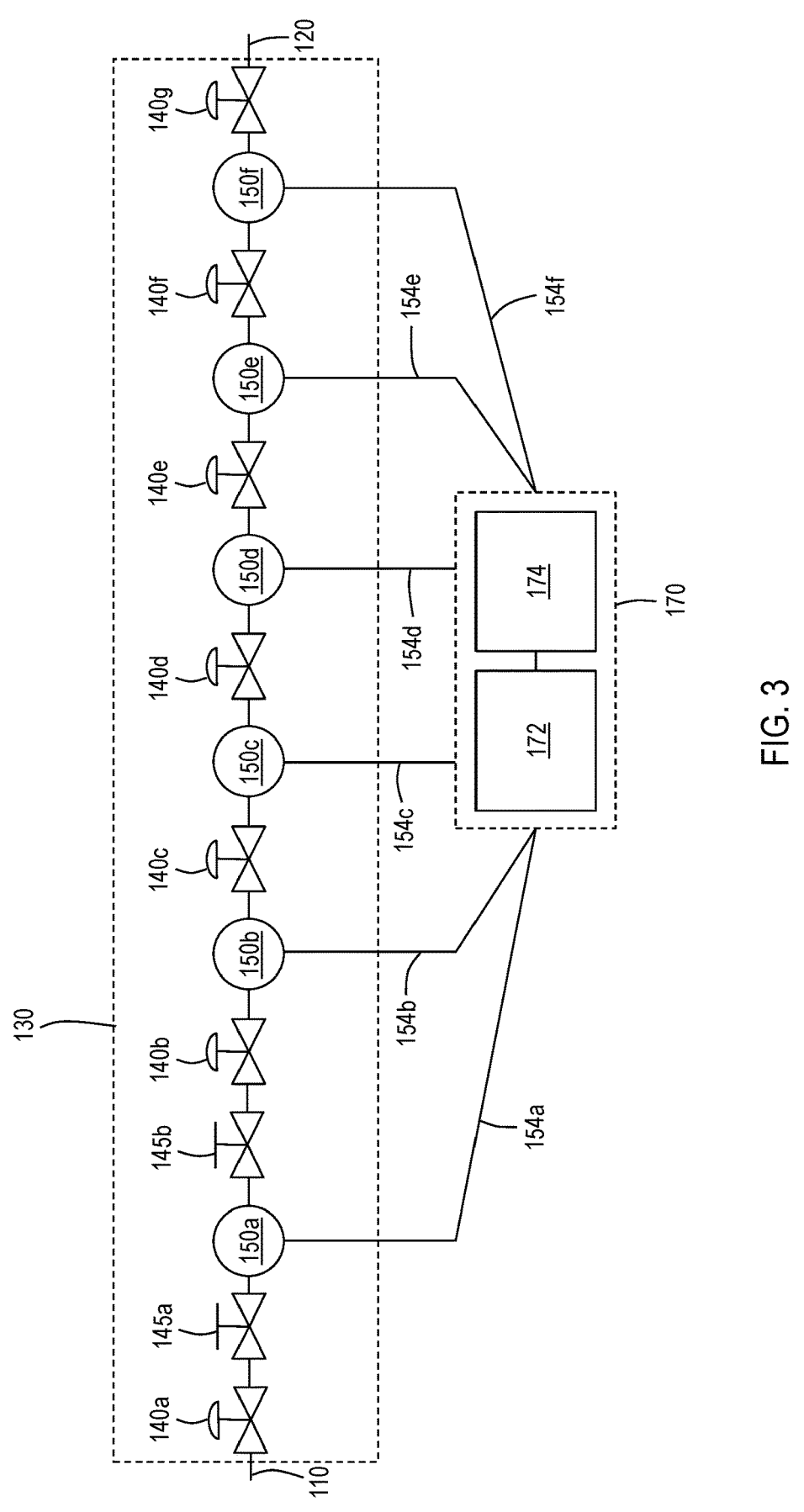
FIG. 3 illustrates a schematic representation of a portion of a chemical precursor recovery system with cold traps arranged in series with a temperature gradient according to one or more embodiment of the disclosure.

In CVD/etch mode, as shown in FIG. 3 and discussed further below, cold traps are arranged in series with decreasing temperatures to achieve fractional condensation of the exhaust vapors. Cold traps are separated by pneumatic valves and are each connected to a compressor and cylinder. After the process pneumatic valves are closed, cold traps are warmed up, and chemicals contained therein are collected. The first cold trap has manual valves to isolation from the system and recovery of the precursors.

The cold traps can be followed by gas separation membranes. In the illustrated embodiments, there are two GSMs. The first GSM separates small molecules (e.g., $H_2$, He, $CO_2$, $CH_4$), fed to the second GSM to recover $H_2$ and He.

An activated charcoal filter can be added to trap additional chemicals (e.g., $H_2S$, volatile organic chemicals (VOCs)), which can be recovered by heat treatment.

One or more embodiments of the disclosure is directed to a chemical precursor recovery system 100. The chemical precursor recovery system 100 includes a cold trap inlet line 110, a plurality of cold traps 130 and a cold trap outlet line 120. The cold trap inlet line 110 of the chemical precursor recovery system 100 is downstream of a processing chamber 102 so that the exhaust stream from the processing chamber 102 flows into the chemical precursor recovery system 100 through the cold trap inlet line 110. As illustrated in the Figures, the plurality of cold traps 130 includes at least one cold trap 150 and at least one pneumatic valve 140 and/or manual valve 145.

Figure 2:
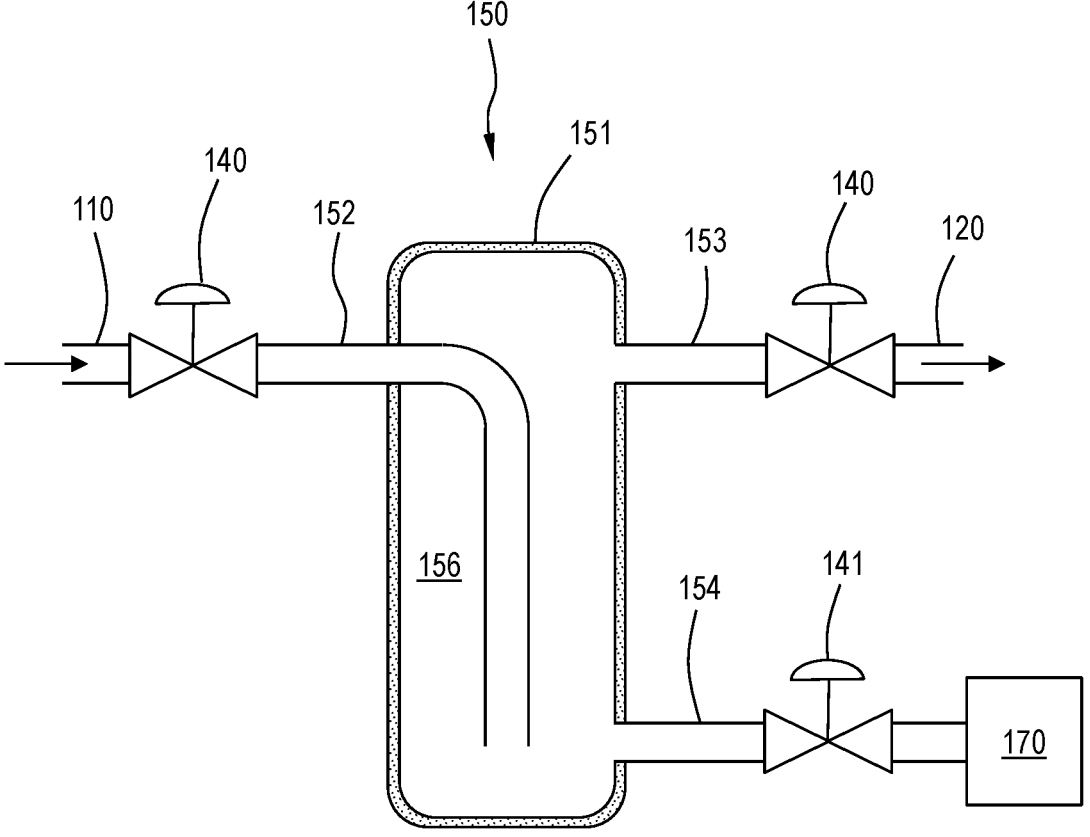
FIG. 2 illustrates a cross-sectional schematic view of a cold trap according to one or more embodiment of the disclosure.

FIG. 2 shows a schematic representation of a cold trap 150 in accordance with one or more embodiments of the disclosure. The cold trap 150 illustrated has a cooled and/or insulated wall 151. A cold trap inlet line 110 allows a flow of gas to enter the cold trap 150 through pneumatic valve 140 and inlet line 152. The illustrated embodiment has one pneumatic valve 140 on the inlet end of the cold trap 150. However, the skilled artisan will recognize that there can be one or more different types of valves at the inlet end of the cold trap 150 and that the scope of the disclosure is not limited to having one pneumatic valve 140. The gas flows into the interior 156 of the cold trap 150 where condensation occurs, based on the temperature of the cold trap 150 and the particular chemistry being condensed. The gas flow can then exit the interior 156 of the cold trap 150 through outlet line 153, a pneumatic valve 140 and cold trap outlet line 120 to the downstream components of the chemical precursor recovery system 100.

When an amount of condensate has been collected in the cold trap 150, pneumatic valve 141 can be opened, allowing the condensate to flow from the interior 156 of the cold trap 150 through collection line 154 into a collection system 170. Again, the skilled artisan will recognize that the pneumatic valve 141 illustrated can be any suitable valve or combination of valves without deviating from the scope of the disclosure. Additionally, the skilled artisan will recognize that the location of the collection line 154 can be at any suitable location. For example, it may be advantageous to locate the collection line 154 at the bottom of the cold trap 150.

Referring again to FIG. 1, the plurality of cold traps 130 are downstream of and in fluid communication with the cold trap inlet line 110. The plurality of cold traps 130 is upstream of and in fluid communication with the cold trap outlet line 120. Stated differently, the cold trap outlet line 120 is downstream of and in fluid communication with the plurality of cold traps 130.

Each cold trap 150 of the plurality of cold traps 130 is configured to condense a chemical precursor. As used in this manner, a cold trap 150 is configured to condense a chemical precursor by maintaining the cold trap at a predetermined temperature based on the chemical precursor of interest. In some embodiments, any of the cold trap 150 are maintained at a temperature less than or equal to the boiling point or sublimation point of the chemical precursor of interest.

In the embodiment illustrated in FIG. 1, the cold traps 150 of the plurality of cold traps 130 are arranged in parallel with an inlet junction 132 and an outlet junction 134. The inlet junctions 132 are connected to and in fluid communication with cold trap inlet line 110. The outlet junction 134 is connected to and in fluid communication with the cold trap outlet line 120.

The embodiment shown in FIG. 1 has three separate cold trap lines; a first cold trap line 155a, a second cold trap line 155b and a third cold trap line 155c. For ease of description, the collection system 170 is not illustrated in FIG. 1, although the collection system 170 can be integrated into the chemical precursor recovery system 100 or can be a separate component. As a separate component, a cold trap 150 can be removed from the plurality of cold traps 130 and then connected to the collection system 170 for emptying.

Each cold trap line 155a, 155b, 155c in the illustrated embodiment has a pneumatic valve 140 and a manual valve 145 upstream of and in fluid communication with the cold trap 150. Additionally, each cold trap line 155a, 155b, 155c has a manual valve 145 and a pneumatic valve 140 downstream of and in fluid communication with the cold trap 150. In the illustrated embodiment, the manual valves 145 are closer to the cold traps 150 than the pneumatic valves 140. In some embodiments, the pneumatic valves 140 are closer to the cold traps 150 than the manual valves 145.

In operation, a flow of exhaust gases exiting the processing chamber 102 and flowing through cold trap inlet line 110 into the plurality of cold traps 130 is split at inlet junction 132 into one of the plurality of cold traps 130. In some embodiments, the inlet junction 132 includes a proportioning valve (not shown) to control flow of exhaust gases to each individual cold trap 130. In some embodiments, the inlet junction 132 is a flow splitting fitting that allows the flow of exhaust gases to split into multiple exhaust flows, each exhaust flow passing through one of the cold trap 150. When one of the cold trap 150 has accumulated a predetermined volume of condensate, the controller 190 closes the pneumatic valves 140 on either side of the cold trap 150. A manual operator can then close the manual valve 145 on either side of the subject cold trap 150, allowing the cold trap 150 to be removed from the plurality of cold traps 130 to be emptied or replaced. In some embodiments, all of the valves before and after any given cold trap 150 in the plurality of cold traps 130 are pneumatic valves 140. In some embodiments, all of the valves before and after any given cold trap 150 in the plurality of cold traps 130 are manual valves 145. In some embodiments, each cold trap 150 has one or more of an upstream pneumatic valve 140 or upstream manual valve 145, and one or more of a downstream pneumatic valve 140 or downstream manual valve 145, to isolate each cold trap 150 separately from the plurality of cold traps 130.

In some embodiments, the chemical precursor recovery system 100 includes a bypass line 160 in fluid communication with the cold trap inlet line 110 and the cold trap outlet line 120. The bypass line 160 connects to the cold trap inlet line 110 upstream of the inlet junction 132 and connects to the cold trap outlet line 120 downstream of the outlet junction 134.

The bypass line 160 of some embodiments comprises an upstream bypass valve 162 and a downstream bypass valve 164 to isolate the bypass line 160 from the plurality of cold traps 130. The upstream bypass valve 162 and downstream bypass valve 164 illustrated in FIG. 1 are pneumatic valves, or some other type of computer controlled valve. In some embodiments, the upstream bypass valve 162 and/or downstream bypass valve 164 are manual valves.

The embodiment illustrated in FIG. 1 is particularly useful where there is one precursor or chemical species to be recovered. For example, a hafnium-containing precursor flowing in an inert gas, where the hafnium-containing precursor is to be recovered and the inert gas is irrelevant. In some embodiments, the processing chamber 102 is an atomic layer deposition (ALD) processing chamber, and the cold trap inlet line 110 is in fluid communication with an atomic layer deposition (ALD) processing chamber exhaust.

FIG. 3 illustrates a portion of the chemical precursor recovery system 100 in which the plurality of cold traps 130 and collection system 170 are shown. In this embodiments, the plurality of cold traps 130 are arranged in series, connecting the cold trap inlet line 110 to the cold trap outlet line 120 through each cold trap 150 in the plurality of cold traps 130.

In some embodiments, the plurality of cold traps 130 are arranged with a decreasing temperature gradient from the cold trap inlet line 110 to the cold trap outlet line 120. The highest temperature cold trap is first or closest to the cold trap inlet line 110, and the lowest temperature cold trap cold trap is last or closest to the cold trap outlet line 120.

While the illustrated embodiment has six cold traps arranged in series, this is merely representative of one possible configuration and should not be taken as limiting the scope of the disclosure. In some embodiments, there are more than or less than six cold traps arranged in series in the plurality of cold traps 130.

In some embodiments, each cold trap 150 in the plurality of cold traps 130 are maintained at different temperature during use. By way of example only, the first cold trap 150a is held at a higher temperature than the second cold trap 150b, which is held at a higher temperature than the third cold trap 150c, which is held at a higher temperature than the fourth cold trap 150d, which is held at a higher temperature than the fifth cold trap 150e, which is held at a higher temperature than the sixth cold trap 150f.

In some embodiments, two or more of the cold traps are maintained at substantially the same temperature within the plurality of cold traps 130. As used in this manner, the term "substantially the same temperature" means that the subject cold traps are maintained at a temperature where condensation of the same components of the effluent occurs without additional compounds condensing. For example, if the temperature of the first cold trap 150a is five degrees Celsius greater than the second cold trap 150b, but no additional gaseous species in the effluent condense at that temperature difference, than the first cold trap 150a and the second cold trap 150b are considered to be at substantially the same temperature. In some embodiments, at least one of the cold trap 150 in the plurality of cold traps 130 is maintained at a substantially different temperature than at least one other of the cold trap 150 in the plurality of cold traps 130, creating a temperature gradient.

In some embodiments, the plurality of cold traps 130 comprises one or more of an upstream manual valve 145a or upstream pneumatic valve 140a upstream of one or more of the cold traps 150. In some embodiments, the plurality of cold traps 130 comprises one or more of a downstream pneumatic valve 140b or downstream manual valve 145b downstream of one or more of the cold traps 105.

In the illustrated embodiment, the first cold trap 150a, which is the cold trap closest to the inlet line 110, has one or more of an upstream manual valve 145a or upstream pneumatic valve 140a, and one or more of a downstream pneumatic valve 140b or downstream manual valve 145b to isolate the first cold trap 150a. When all of the upstream pneumatic valve 140a, upstream manual valve 145a, the downstream pneumatic valve 140b and downstream manual valve 145b are closed, the first cold trap 150a can be removed from the plurality of cold traps 130 without breaking the pressure maintained within the chemical precursor recovery system 100.

In some embodiments, the plurality of cold traps 130 further comprises a pneumatic valve positioned between each of the cold traps 150, and one or more of a pneumatic valve or manual valve downstream of the last cold trap. For example, in the illustrated embodiment, downstream pneumatic valve 140b (downstream relative to the first cold trap 150a) is upstream of the second cold trap 150b, and pneumatic valve 140c is downstream of the second cold trap 150b and upstream of the third cold trap 150c. Pneumatic valve 140d is downstream of the third cold trap 150c and upstream of the fourth cold trap 150d. Pneumatic valve 140e is downstream of the fourth cold trap 150d and upstream of the fifth cold trap 150e. Pneumatic valve 140f is downstream of the fifth cold trap 150e and upstream of the sixth cold trap sixth cold trap 150f. Pneumatic valve 140g is downstream of the sixth cold trap 150f.

In some embodiments, as shown in FIG. 3, each cold trap 150a-f is connected to a downstream collection system 170 through a collection line 154a-f with a valve (not shown). In some embodiments, the collection system 170 comprising one or more of a compressor 172 or gas cylinder 174. In some embodiments, the collection system 170 comprises both a compressor 172 and a gas cylinder 174, the compressor 172 compressing the gases from the cold trap and filling the gas cylinder 174 with the compressed gas.

The embodiment illustrated in FIG. 3 is particularly useful where there is more than one precursor or chemical species to be recovered from the effluent. For example, a hafnium-containing precursor and a tantalum-containing precursor flowing in an inert gas, where the hafnium-containing precursor and the tantalum-containing precursor are to be recovered and the inert gas is irrelevant. The temperature gradient of the cold traps allows for the separate condensation of the two precursors from the same effluent stream. In some embodiments, the processing chamber 102 is one or more of a chemical vapor deposition (CVD) processing chamber or an etch chamber, and the cold trap inlet line 110 is in fluid communication with one or more of the chemical vapor deposition (CVD) processing chamber or etch chamber exhaust.

Referring again to FIG. 1, the chemical precursor recovery system 100 of some embodiments further comprises one or more gas separation module (GSM) downstream of and in fluid communication with the cold trap outlet line 120. In the illustrated embodiment, there are two gas separation modules arranged in series downstream of the cold trap outlet line 120. Effluent in the cold trap outlet line 120 enters the first gas separation module 180a where small molecules are separated from the effluent. The separated small molecules flow into the second gas separation module 180b while the other effluent components continue downstream to the activated charcoal filter 182. The first gas separation module 180a of some embodiments separates small molecules like methane ($CH_4$), carbon monoxide (CO), carbon dioxide ($CO_2$), molecular nitrogen ($N_2$), nitrous oxide ($N_2O$), argon (Ar), molecular hydrogen ($H_2$), helium (He), krypton (Kr), etc., from the effluent. In some embodiments, the second gas separation module 180b separates the molecular hydrogen ($H_2$) and/or helium (He) from the effluent exiting the first gas separation module 180a.

Effluent exiting the first gas separation module 180a that is not separated by the first gas separation module 180a flows into the activated charcoal filter 182 located downstream of the first gas separation module 180a. The activated charcoal filter 182 of some embodiments is effective to collect or remove volatile organic compounds (VOCs) and/or hydrogen sulfide ($H_2S$) from the effluent stream. The activated charcoal filter 182 can be baked at elevated temperature to release the compounds bound the activated charcoal and recover the activated charcoal filter 182 for further use.

In some embodiments, the chemical precursor recovery system 100 further comprises a pump 184 downstream of the activated charcoal filter 182 and a scrubber 186 downstream of the pump 184. The pump 184 of some embodiments is effective to ensure that the effluent flow continues downstream to exit the chemical precursor recovery system 100. The scrubber 186 of some embodiments is included as a precautionary measure in the event that a hazardous chemical is not separated from the effluent after passing through the chemical precursor recovery system 100.

In some embodiments, as shown in FIG. 1, a controller 190 is coupled to the chemical precursor recovery system 100 and/or processing chamber 102 for controlling the processing chamber 102, chemical precursor recovery system 100 or components thereof. For example, the system controller 190 may control the operation of the processing chamber 102, the pneumatic valves (or other computer controller valves) and any monitoring components known to the skilled artisan that are included in the system. In operation, the system controller 190 enables data collection and feedback from the processing chamber 102 and/or chemical precursor recovery system 100 to coordinate system performance.

The system controller 190 generally includes a central processing unit (CPU) 192, memory 194, and support circuits 196. The CPU 192 may be one of any form of a general-purpose processor that can be used in an industrial setting. The memory 194, or non-transitory computer-readable medium, is accessible by the CPU 192 and may be one or more of memory such as random-access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, for example, a software routine. When the computer instruction code is executed by the CPU 192, the CPU 192 controls the chambers or valves to perform processes in accordance with the various methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A chemical precursor recovery system comprising:
   a cold trap inlet line;
   a plurality of cold traps downstream of and in fluid communication with the cold trap inlet line, the plurality of cold traps configured to condense a chemical precursor, the plurality of cold traps arranged in series with a decreasing temperature gradient with a lowest temperature cold trap last and each of the plurality of cold traps connected to a downstream collection system through a collection line with a valve, the downstream collection system comprising one or more of a compressor or gas cylinder;
   a cold trap outlet line downstream of and in fluid communication with the plurality of cold traps, and
   an activated charcoal filter downstream of the cold trap outlet line.

2. The chemical precursor recovery system of claim 1, further comprising a bypass line in fluid communication with the inlet line upstream of the inlet junction and in fluid communication with the outlet line downstream of the outlet junction.

3. The chemical precursor recovery system of claim 2, wherein the bypass line further comprises an upstream bypass valve and a downstream bypass valve to isolate the bypass line from the plurality of cold traps.

4. The chemical precursor recovery system of claim 1, wherein each cold trap has one or more of an upstream pneumatic valve or upstream manual valve, and one or more of a downstream pneumatic valve or downstream manual valve, to isolate each cold trap separately from the plurality of cold traps.

5. The chemical precursor recovery system of claim 2, wherein the inlet line is in fluid communication with an atomic layer deposition (ALD) processing chamber exhaust.

6. The chemical precursor recovery system of claim 1, wherein each of the plurality of cold traps are at different temperatures.

7. The chemical precursor recovery system of claim 1, further comprising one or more of an upstream manual valve or upstream pneumatic valve upstream of one or more of the cold traps, and one or more of a downstream pneumatic valve or downstream manual valve downstream of one or more of the cold traps.

8. The chemical precursor recovery system of claim 1, wherein the cold trap closest to the cold trap inlet line has one or more of an upstream manual valve or upstream pneumatic valve, and one or more of a downstream pneumatic valve or downstream manual valve to isolate the cold trap.

9. The chemical precursor recovery system of claim 8, further comprising a pneumatic valve between each of the cold traps, and one or more of a pneumatic valve or manual valve downstream of the last cold trap.

10. The chemical precursor recovery system of claim 1, wherein the inlet line is in fluid communication with a chemical vapor deposition (CVD) processing chamber exhaust.

11. A chemical precursor recovery system comprising:
   a cold trap inlet line;
   a plurality of cold traps downstream of and in fluid communication with the inlet line, each of the plurality of cold traps configured to condense a chemical precursor;
   a cold trap outlet line downstream of and in fluid communication with the plurality of cold traps;
   one or more gas separation module (GSM) downstream of and in fluid communication with the cold trap outlet line, wherein there are two GSMs in series downstream of the cold trap outlet line, the first GSM separating one or more of methane ($CH_4$), carbon monoxide (CO), carbon dioxide ($CO_2$), molecular nitrogen ($N_2$), nitrous oxide ($N_2O$), argon (Ar), and krypton (Kr) from effluent in the cold trap outlet line, the second GSM separating hydrogen (H2) and helium (He) from effluent exiting the first GSM; and an activated charcoal filter downstream of the one or more GSM.

12. The chemical precursor recovery system of claim 11, further comprising a pump downstream of the activated charcoal filter.

13. The chemical precursor recovery system of claim 12, further comprising a scrubber downstream of the pump.

14. A chemical precursor recovery system for an atomic layer deposition processing chamber, the chemical precursor recovery system comprising:

a cold trap inlet line configured to be connected to an exhaust line of the atomic layer deposition processing chamber;

a cold trap outlet line downstream of the cold trap inlet line;

a plurality of cold traps downstream of and in fluid communication with the inlet line, each of the plurality of cold traps configured to condense a chemical precursor, the plurality of cold traps arranged in parallel with an inlet junction connected to and in fluid communication with the cold trap inlet line and an outlet junction connected to and in fluid communication with the cold trap outlet line downstream of the plurality of cold traps, each cold trap having one or more of an upstream pneumatic valve or upstream manual valve, and one or more of a downstream pneumatic valve or downstream manual valve, to isolate each cold trap separately from the plurality of cold traps;

a bypass line in fluid communication with the inlet line upstream of the inlet junction and in fluid communication with the outlet line downstream of the outlet junction, the bypass line comprising an upstream bypass valve and a downstream bypass valve to isolate the bypass line from the plurality of cold traps;

one or more gas separation module (GSM) downstream of and in fluid communication with the cold trap outlet line, wherein there are two GSMs in series downstream of the cold trap outlet line, the first GSM separating one or more of methane ($CH_4$), carbon monoxide (CO), carbon dioxide ($CO_2$), molecular nitrogen ($N_2$), nitrous oxide ($N_2O$), argon (Ar), and krypton (Kr) from effluent in the cold trap line, the second GSM separating hydrogen ($H_2$) and helium (He) from effluent exiting the first GSM; and an activated charcoal filter downstream of the GSM.

15. The chemical precursor recovery system of claim 14, further comprising a pump downstream of the activated charcoal filter.

16. The chemical precursor recovery system of claim 15, further comprising a scrubber downstream of the pump.

17. A chemical precursor recovery system for a chemical vapor deposition processing chamber, the chemical precursor recovery system comprising:

a cold trap inlet line;

a plurality of cold traps downstream of and in fluid communication with the inlet line, each of the cold traps configured to condense a chemical precursor, the plurality of cold traps arranged in series with a decreasing temperature gradient with the lowest temperature cold trap last, the cold trap closest to the inlet line has one or more of an upstream manual valve or upstream pneumatic valve, and one or more of a downstream pneumatic valve or downstream manual valve to isolate the cold trap, a pneumatic valve is positioned between each of the cold traps, and one or more of a pneumatic valve or manual valve downstream of the last cold trap;

a cold trap outlet line downstream of and in fluid communication with the plurality of cold traps;

each cold trap is connected to a downstream collection system through a collection line with a valve, the collection system comprising one or more of a compressor or gas cylinder; and an activated charcoal filter downstream of the cold trap outlet line.

18. The chemical precursor recovery system of claim 17, further comprising a pump downstream of the activated charcoal filter.

19. The chemical precursor recovery system of claim 18, further comprising a scrubber downstream of the pump.

* * * * *